United States Patent
Fukao et al.

(10) Patent No.: US 7,118,933 B2
(45) Date of Patent: Oct. 10, 2006

(54) METHOD FOR MANUFACTURING OPTICAL BENCH, OPTICAL BENCH, OPTICAL MODULE, SILICON WAFER SUBSTRATE IN WHICH WIRING AND GROOVE ARE FORMED, AND WAFER

(75) Inventors: Ryuzou Fukao, Moriya (JP); Tetsuhiko Sanbe, Toride (JP)

(73) Assignee: Hitachi Maxell, Ltd., Osaka (JP)

( * ) Notice: Subject to any disclaimer, the term of this patent is extended or adjusted under 35 U.S.C. 154(b) by 17 days.

(21) Appl. No.: 10/863,339

(22) Filed: Jun. 9, 2004

(65) Prior Publication Data

US 2004/0266093 A1    Dec. 30, 2004

(30) Foreign Application Priority Data

Jun. 11, 2003  (JP)  ............... 2003-165986

(51) Int. Cl.
*H01L 21/00* (2006.01)
*H01L 21/76* (2006.01)
*H01L 21/311* (2006.01)

(52) U.S. Cl. .................. 438/43; 438/421; 438/700; 438/701

(58) Field of Classification Search ................. 438/42, 438/43, 421, 700, 701
See application file for complete search history.

(56) References Cited

U.S. PATENT DOCUMENTS

| | | | |
|---|---|---|---|
| 6,879,035 B1* | 4/2005 | Syllaios et al. | 257/704 |
| 2005/0070059 A1* | 3/2005 | Blakers et al. | 438/200 |
| 2005/0269700 A1* | 12/2005 | Farnworth et al. | 257/737 |
| 2006/0009038 A1* | 1/2006 | Cohen et al. | 438/697 |

OTHER PUBLICATIONS

English language abstract of JP 2002-162542 (Jun. 7, 2002).

* cited by examiner

*Primary Examiner*—Ngân V. Ngô
(74) *Attorney, Agent, or Firm*—Birch, Stewart, Kolasch & Birch, LLP

(57) ABSTRACT

An optical bench on which an optical component is mounted comprises an Si substrate made of a silicon wafer, a groove disposed on the Si substrate and designed to mount the optical component thereon, and a metal thin-film wiring for driving the optical component or a driver component. The metal thin-film wiring is formed in an electroless plating process before a groove manufacturing process which forms the groove by micromachining by means of wet processing.

7 Claims, 9 Drawing Sheets

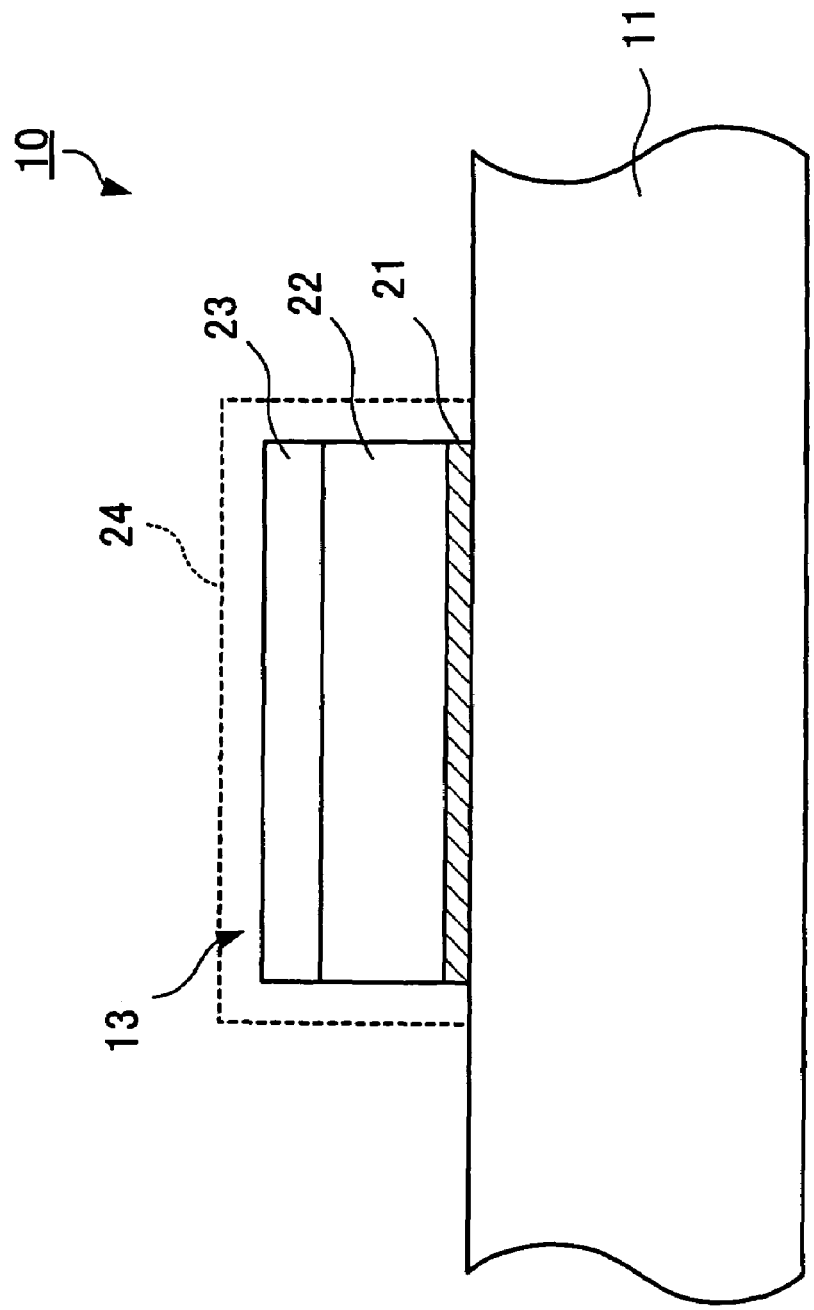

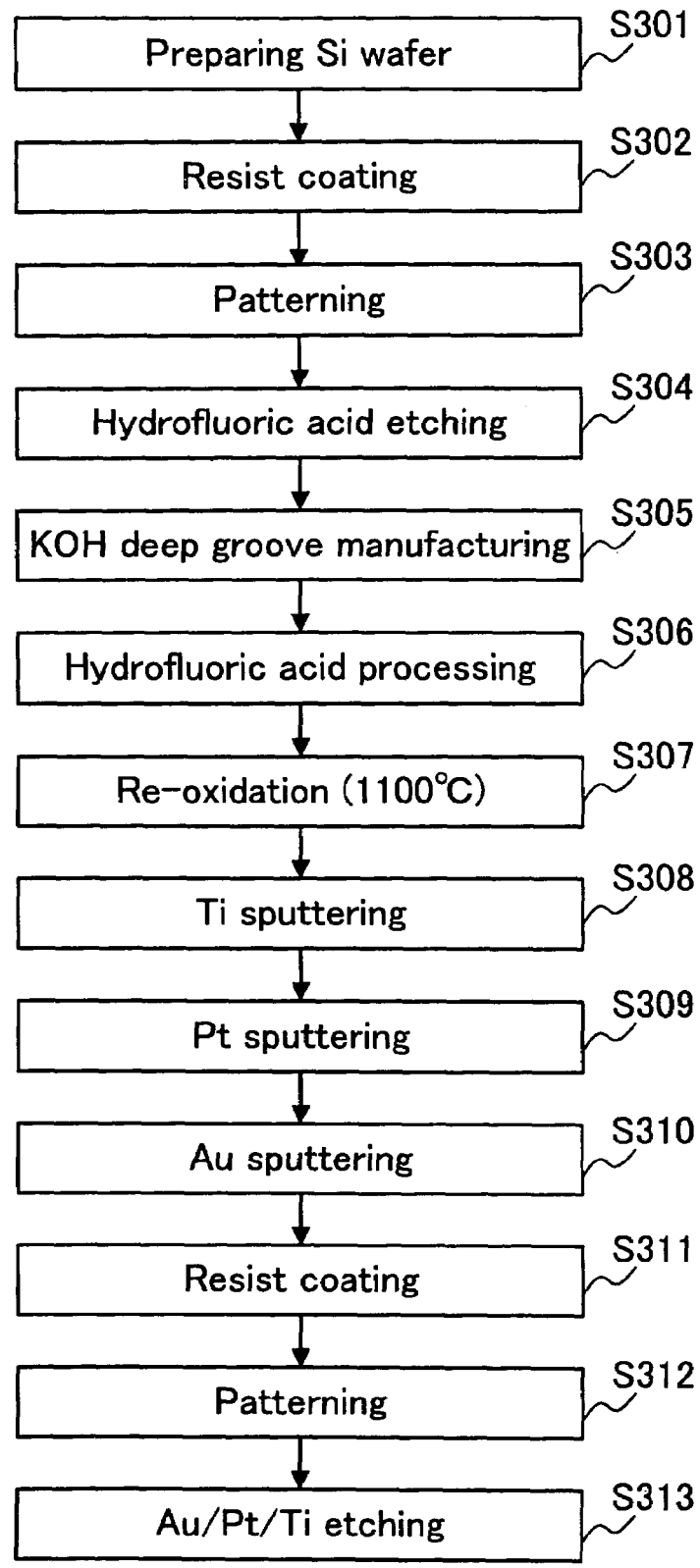

METHOD FOR MANUFACTURING OPTICAL BENCH, OPTICAL BENCH, OPTICAL MODULE, SILICON WAFER SUBSTRATE IN WHICH WIRING AND GROOVE ARE FORMED, AND WAFER

BACKGROUND OF THE INVENTION

This Nonprovisional application claims priority under 35 U.S.C. § 119(a) on Patent Application No(s). 2003-165986 filed in JAPAN on Jun. 11, 2003, the entire contents of which are hereby incorporated by reference.

The present invention relates to a substrate to mount, e.g., an optical component thereon, and a manufacturing method thereof or the like. More particularly, the invention relates to a substrate in which a wiring is formed and a predetermined groove is manufactured, and a manufacturing method thereof or the like.

A recent progress in the optical communication technology has increased needs for, e.g., various components and devices used for a network, and optical modules using the same, and research and development have been actively conducted. Especially, a module, in which components such as an optical fiber, a lens, and a laser diode are appropriately combined, has been often used as a basic component.

As a conventional technology of such an optical element module, there has been disclosed, for example, an optical element module in which a groove is disposed in an Si substrate, a spherical lens is positioned and fixed in the groove, and a predetermined wiring is formed on the Si substrate (see Patent Document 1, for example). Such a module has several forms. Among those forms, a method of forming a groove in an Si wafer by micromachining (MEMS), which is a 3-dimensional manufacturing technology, and embedding and fixing a fiber or a lens in the groove has been a focus of attention as a method of excellent mass productivity. A substrate for an optical module formed by the MEMS is called a silicon optical bench (bench, or optical bench), and constitutes one of key devices.

The optical bench constituted of a silicon wafer has high mass productivity because it can be formed by processing a single wafer. However, when the optical bench is mounted with a component having a wiring such as a laser diode, it has difficulties with the process. Specifically, while the wiring is generally formed as a metal-thin film by sputtering or the like and manufactured by patterning by means of photolithography or the like, a metal, which is a wiring material, is corroded when wiring formation is carried out first because the Si groove manufacturing by etching is executed using a strong alkali such as a potassium hydroxide (KOH). Since a protective film such as a resist or the like also has no sufficient resistance to the strong alkali, complete protection is difficult. In reality, therefore, the wiring formation is carried out after the groove manufacturing.

FIG. 6 is a flowchart schematically showing conventional bench manufacturing processes. First, an Si wafer prepared in step 301 is coated with a resist (step 302), and a mask is put thereon to execute patterning of a groove part thereof (step 303). Then, a film of a silicon dioxide is removed by hydrofluoric acid etching (step 304). Subsequently, KOH deep groove manufacturing is carried out, which is wet anisotropic etching that uses a strong alkali with the residual $SiO_2$ as a mask (step 305). As a result, a groove for mounting an optical component on the Si wafer is deeply formed by etching.

When the groove manufacturing is carried out, a periphery of the groove is etched into an undercut shape, and thus an oxide film is left into a flash shape. Since the residual oxide film adversely affects resist flowing during resist coating, the residual oxide film is removed by hydrofluoric acid processing (step 306). As a result, the oxide film is completely removed from the Si wafer surface, and an oxide film is formed again to manufacture a wiring (step 307). Subsequently, Ti sputtering (step 308), Pt sputtering (step 309), Au sputtering (step 310) are executed, and Au/Pt/Ti etchings are executed (step 313) after the resist coating (step 311) and patterning (step 312), whereby a wiring is formed on the Si wafer in which the groove has been manufactured. In this example, the wiring is constituted of 3-layer sputtered thin films of Au/Pt/Ti, and Pt/Ti constitute adhesive layers of Au to Si. In reality, however, a resistance film, such as a TaN, a high-temperature solder land, such as an Au—Sn film, and the like as well as such a conductor wiring are formed and patterned as appropriate.

(Patent Document 1)
Japanese Patent Application Laid-Open No. 2002-162542 (pp. 3 to 4, FIG. 10)

However, in bench manufacturing processes as shown in FIG. 6, it is necessary to carry out processes of resist coating, exposure and the like for wiring pattering in a state in which the groove is present in the Si wafer, as described above. For this resason, coating performance is extremely reduced, and alignment accuracy is lowered, thereby causing a reduction in yield and a reduction in wiring accuracy. For example, the yield is normally below 50%, and the wiring accuracy needs a tolerance of about ±5 to 10 μm.

Furthermore, a so-called oxide film-added wafer having an oxide film formed on a surface thereof is used to manufacture the wiring. However, when the groove manufacturing is carried out, as described above, the periphery of the groove is etched into an undercut shape, whereby the oxide film is left into a flash shape. Since the residual oxide film adversely affects resist flowing during the resist coating, the residual oxide film must be removed by hydrofluoric acid processing, as described with reference to the step 306 of FIG. 6. Thus, since the oxide film is completely removed from the wafer surface by the hydrofluoric acid processing, it is necessary to form an oxide film again to manufacture the wiring, as described with reference to the step 307 of FIG. 6. This film formation requires, for example, a high-temperature heat treatment of about 1100° C., thereby causing a reduction in process efficiency. In addition, such re-oxidation may generate, e.g., a very small flash in an edge part. Additionally, the formation of the oxide film is all carried out in the thin film process of sputtering or the like, and not always satisfactory in terms of mass production efficiency.

SUMMARY OF THE INVENTION

The present invention has been made to solve the foregoing technical problems, and an object of the invention is to drastically increase efficiency in the manufacturing processes of a substrate in which a groove and a wiring are formed, and to facilitate improvement of the yield and shorten the process time.

Another object of the invention is to improve wiring accuracy in manufacturing an optical bench.

In order to achieve those objects, according to the present invention, wiring formation is carried out by plating, and, also, wiring formation is carried out in a state in which an oxide film is deposited on a wafer surface before the groove manufacturing. Specifically, the invention is a method for manufacturing an optical bench on which an optical component is mounted, and comprises: a plating process of forming a wiring pattern of a metal-thin film by electroless plating on a substrate; and subsequently a groove manufacturing process which manufactures a groove by wet processing in the substrate having the wiring pattern formed by the plating process.

If the plating process forms the wiring pattern by electroless plating, the plating process is preferable, for example, because a reaction speed can be set at a low level, and a highly uniform film with a small residual strain can be obtained. Accordingly, a dense film, which is different from a microporous film in a sputtered film or the like, can be obtained, whereby any film damage such as pitting corrosion does not occur. Thus, corrosion resistance, including alkali resistance, which a metal originally has, can be exhibited. If the plating process includes a plurality of plating processes, at least one of which executes electroless plating processing on the wiring pattern without any masks, it is advantageous, for example, because etching work is more easily carried out on subsequent layers, which can be deposited in the same pattern, than in a stacked film, and dimension accuracy can be increased.

Moreover, the groove manufacturing process forms the groove in the substrate made of a silicon wafer by micromachining, which uses wet processing. More specifically, if the groove manufacturing process removes an oxide film in a groove part is removed from the substrate having the wiring pattern formed in the plating process, and the groove is formed in the part from which the oxide film is removed, by dipping the substrate in a strong alkali solution, it is possible to form the groove part with an oxide film preformed on the wafer surface as a mask, for example.

If the groove manufacturing process further comprises: a protective film forming process which coats the wiring pattern formed by the plating process with a protective film; and a protective film removing process which removes the protective film after the groove manufacturing process, the process is preferable because stronger resistance to the wiring can be obtained when the groove is manufactured in the Si substrate by a strong alkali. Especially, if the protective film forming process forms a protective film made of a metal containing nickel, it is advantageous in terms of the strong alkali resistance. However, the object of the invention can be achieved even without forming such a protective film.

An optical bench according to the present invention comprises: a substrate in which a groove is formed to mount an optical component thereon; and a wiring pattern of a metal thin-film disposed on the substrate and formed of plating which has corrosion resistance to a strong alkali solution. In this case, if the wiring pattern is, for example, a 2-layer film made of a gold plate and a nickel-phosphorus plate, especially contains a nickel-phosphorus plate, the wiring pattern is preferable as an electrode wiring in terms of film-forming performance, conductivity, corrosion resistance, and the like. In addition, if a phosphorus concentration of the nickel-phosphorus plate is 10% or higher, the nickel-phosphorus plate comes to have a property close to nonmagnetism, and is suitable for a high-frequency wiring application such as a laser diode wiring in an optical module. Further, a phosphorus concentration of 12% or higher is particularly preferably because a nonmagnetic state can practically be attained.

From another viewpoint, an optical module according to the present invention comprises: an optical bench in which a groove is formed and a wiring pattern is formed of plating that has corrosion resistance to a strong alkali solution; an optical component which is positioned and mounted in the groove of the optical bench; and a driver component which is disposed on the optical bench and driven through the wiring pattern.

A silicon wafer substrate according to the present invention in which a wiring pattern and a groove are formed comprises: a silicon wafer substrate; a wiring pattern formed on the silicon wafer substrate; and a deep groove formed in the silicon wafer substrate. Any oxide film other than a natural oxide film is not formed in the deep grove. If any forcible oxidation process is carried out, for example, based on a high-temperature treatment, an oxide film of several-micron order is formed inside the deep groove. In the case of a natural oxide film, an oxide film of only nano-order is formed. If no forcible oxidation process is carried out, it is advantageous because any flash or the like is not left in an edge part. Additionally, the wiring pattern is formed of plating (formed by electroless plating) which has corrosion resistance to a strong alkali solution, or can include a nickel-phosphorus film.

In the invention, as forms in which such a substrate is actually used, there are a state in which device chips such as silicon benches are cut out from the substrate by dicing, and one in which the substrate is in the form of a wafer before device chips are cut out from the substrate. That is, the invention is a wafer which comprises a plurality of chips that are optical benches before chips are cut out from the substrate, and each chip includes: a wiring pattern of a metal thin-film formed of plating which has corrosion resistance to a strong alkali solution; and a groove for mounting an optical component thereon.

The wiring pattern formed on each chip is formed by the plating process using electroless plating, and the groove formed on each chip is formed by a groove manufacturing process which dips a substrate having the wiring pattern formed thereon in a strong alkali solution and manufactures the groove by wet processing. The groove manufacturing process of forming the groove in each chip removes an oxide film from a region in which the groove is formed, and subsequently dips the substrate in the strong alkali solution.

BRIEF DESCRIPTION OF THE DRAWINGS

FIG. 2 is a view showing a sectional structure in which a wiring is formed on the optical bench;

FIG. 6 is a flowchart schematically showing conventional bench manufacturing processes;

DETAILED DESCRIPTION OF THE PREFERRED EMBODIMENT

Hereinafter, the present invention will be described in detail according to an embodiment shown in the accompanying drawings.

Figure 1A:
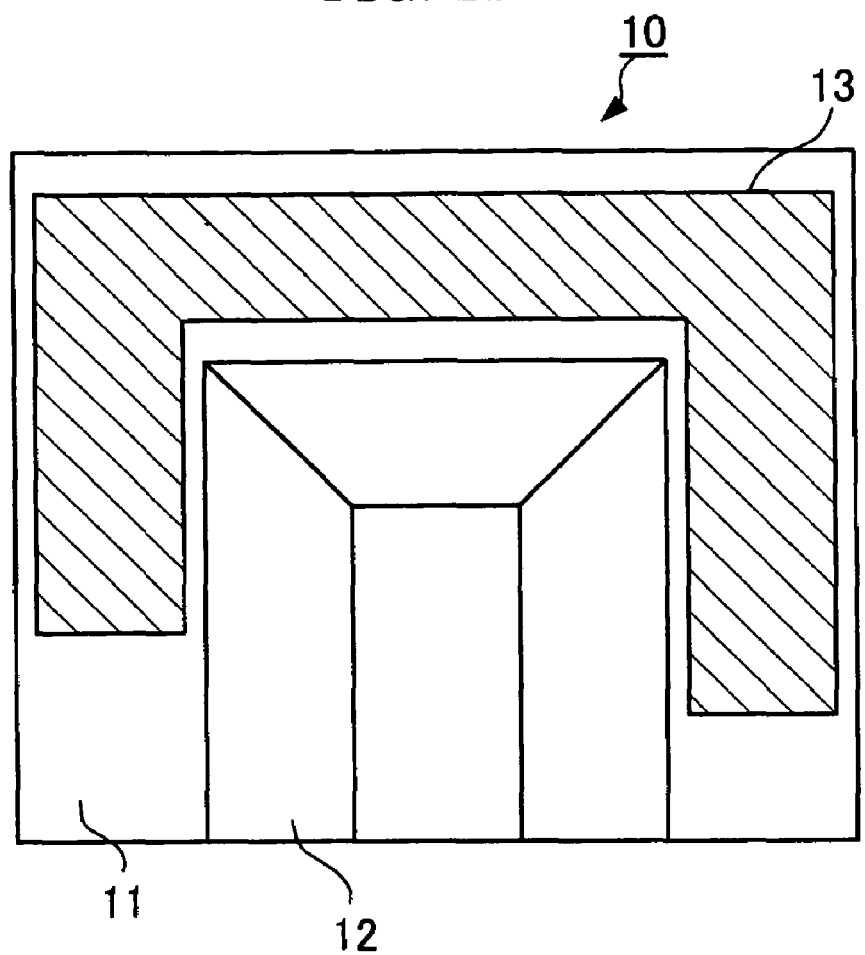
FIGS. 1A and 1B are views showing a constitution of an optical bench according to an embodiment of the present invention.
Figure 1B:
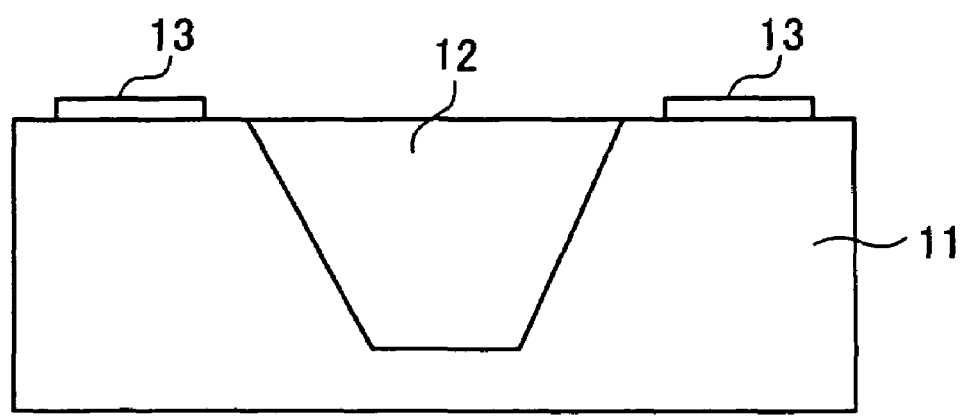

FIGS. 1A and 1B are views showing a constitution of an optical bench according to the embodiment. FIG. 1A is a top view of the optical bench, and FIG. 1B is a side view thereof. In an optical bench (silicon optical bench) 10 according to the embodiment, a groove 12, which is a deep groove for mounting an optical component such as a lens in position, is formed in an Si substrate 11, which is a silicon wafer. A wiring 13 is formed in a predetermined shape on the Si substrate 11. The embodiment has a feature that the wiring 13 is formed of plating. Further, according to the embodiment, in manufacturing processes to be described later, the groove 12 is formed after the formation of the wiring 13 on the Si substrate 11. As a result, the embodiment has another feature that no re-oxidation processing is executed after the formation of the groove 12, and no oxide film ($SiO_2$) is formed on the groove 12. That is, for example, according to a conventional technology in which re-oxidation is forcibly executed at a high temperature of about 1100° C., an oxide film of about 2 to 3 μm (several micron order) is formed in the groove 12. On the other hand, according to the embodiment, such an oxide film is not formed. Even in the embodiment, in which no re-oxidation is forcibly executed, however, an oxide film of about nanometer (nm) order as monoatomic order can be formed by natural oxidation on the groove 12.

FIG. 2 is a view showing a sectional structure in which the wiring 13 is formed on the optical bench 10. In this case, a nickel film/chromium film (Ni/Cr film) 21 is continuously formed to constitute an adhesive layer by sputtering on the Si substrate 11 having the oxide film. A nickel-phosphorus film (Ni—P film) 22 with a phosphorus concentration of, for example, 13% is formed thereon by electroless plating. A gold film (Au film) 23 is deposited in a thickness of about 0.5 μm on the Ni—P film 22 by electroless plating to manufacture the wiring 13. Dimension accuracy of the wiring 13 is within ±3 μm. In the example shown in FIG. 2, the wiring 13 is coated with a nickel protective film (Ni protective film) 24 with a thickness of about 2 μm as a protective film against KOH used for the formation of the groove 12 by electroless plating after the formation of the Au film 23, which is a gold plate. However, this Ni protective film 24 may not always be formed.

If the wiring 13 is made of a thin film by conventional sputtering or the like, there is a micro void or pinhole in the film. Consequently, corrosion reaction such as pitting corrosion occurs to lower durability when the film is dipped into an etching solution such as KOH or the like. According to the embodiment, this film is replaced with a dense plate film to greatly reduce the corrosion reaction, whereby corrosion resistance that the metal originally has can be exhibited. Thus, the groove 12 can be manufactured after the formation of the wiring 13.

As a plating material used for the wiring 13, the two layers of the Au film 23 and the Ni—P film 22, which are generally used in electroless plating as an electrode wiring are suitable in terms of film-forming performance, conductivity, and corrosion resistance. Especially, since a state becomes closer to nonmagnetism as a phosphorus concentration in the nickel-phosphorus film is higher, the two layers are advantageously used for a high-frequency wiring application such as a laser diode wiring in the optical module. Specifically, a phosphorus concentration of 10% or higher is preferable, and, particularly, a concentration of 12% or higher practically causes a nonmagnetic state.

Since the dense and uniform wiring film can be obtained by electroless nickel and metal plating, as described above, the film itself can endure the Si groove manufacturing carried out by strong alkali etching. Moreover, more robust (more sturdy) resistance is secured by disposing the Ni protective film 24, which is a protective film, on such a wiring film. Various materials are available for the protective film. In this case, coating with an electroless plating nickel film is suitable in terms of strong alkali resistance. As described above, this Ni protective film 24 may not always be formed.

Next, description will be made of a method for manufacturing the optical bench 10 according to the embodiment.

Figure 3A:
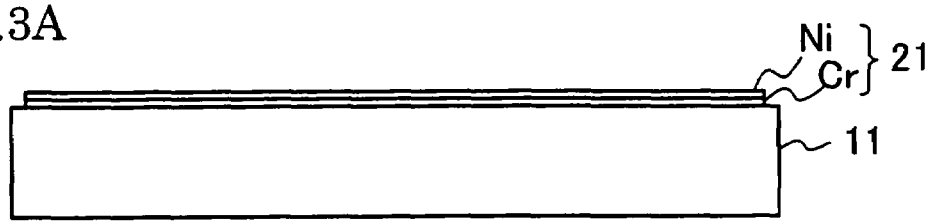
FIGS. 3A to 3F are views illustrating the manufacturing processes of the optical bench.
Figure 3B:
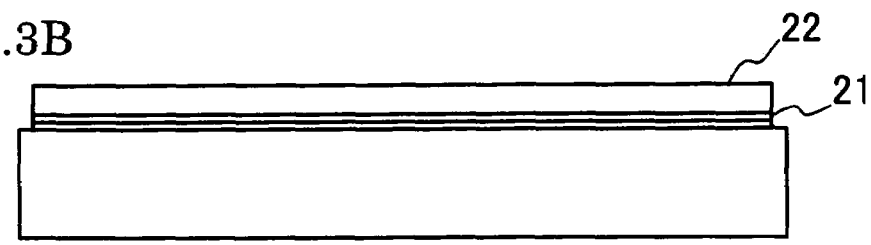
Figure 3C:
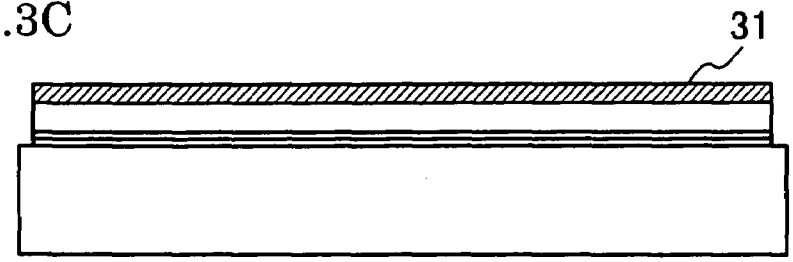
Figure 3D:
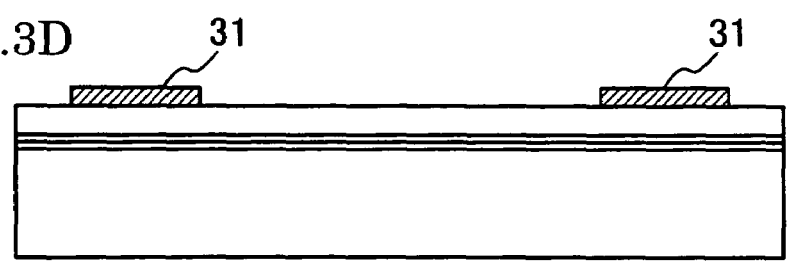
Figure 3E:
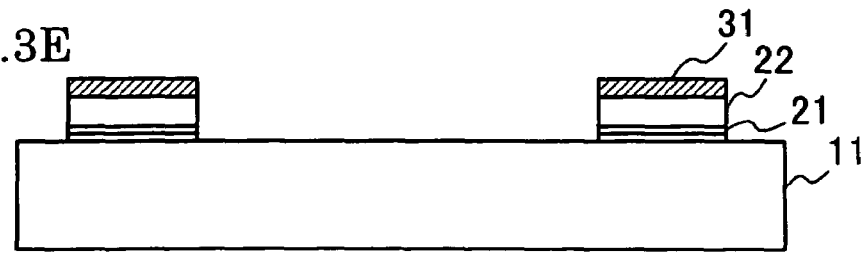

FIGS. 3A to 4K are views illustrating the manufacturing processes of the optical bench 10. First, an Si substrate 11 having an oxide film formed on a surface thereof is prepared, then Cr sputtering and Ni sputtering are executed to form an Ni/Cr film 21 which constitutes an adhesive layer as shown in FIG. 3A. In the process of forming the Ni/Cr film 21, e.g., the Ni film and the Cr film are continuously deposited by sputtering, by 0.1 μm each. Next, as shown in FIG. 3B, a Ni—P film 22 is formed, e.g., in a thickness of about 3 μm by electroless plating. Then, as shown in FIG. 3C, a resist 31 is applied. Subsequently, as shown in FIG. 3D, patterning (pattern formation) is executed by using a mask. Then, as shown in FIG. 3E, the Ni—P film 22 and the Ni/Cr film 21 are etched by a hydrochloric acid to form a basic pattern of a wiring 13. Subsequently, the resist 31 is peeled off.

Figure 3F:
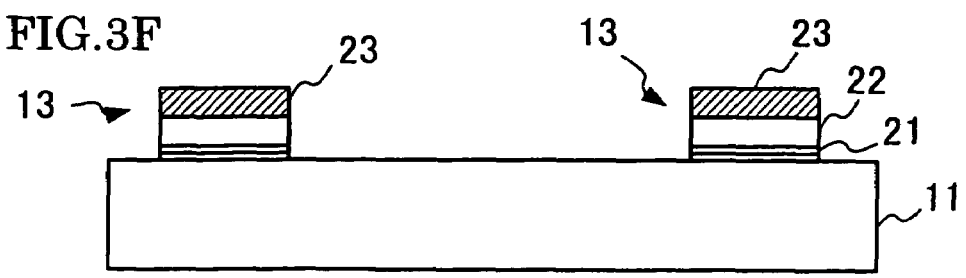

Next, on the Ni—P film 22 from which the resist 31 is removed, as shown in FIG. 3F, an Au film 23 is deposited in a thickness of, e.g., about 0.5 μm, by electroless plating on the basic pattern to manufacture the wiring 13. The Au electroless plating process is carried out on the pattern without any mask. Thus, according to the embodiment, the electroless plating is used as a plating method, and a reaction speed is set to a low level, whereby a highly uniform film with a small residual strain can be obtained, and acceleration of corrosion caused by stress concentration becomes practically less likely to occur. Moreover, in the case of depositing films to form stacked layers by using the electroless plating, only a first layer is etched to be patterned, whereby subsequent layers can be deposited thereon in the same pattern. As a result, it is possible to easily conduct the etching work compared with the case of the stacked layer film, to increase dimension accuracy, and to improve efficiency of the processes.

Figure 4G:
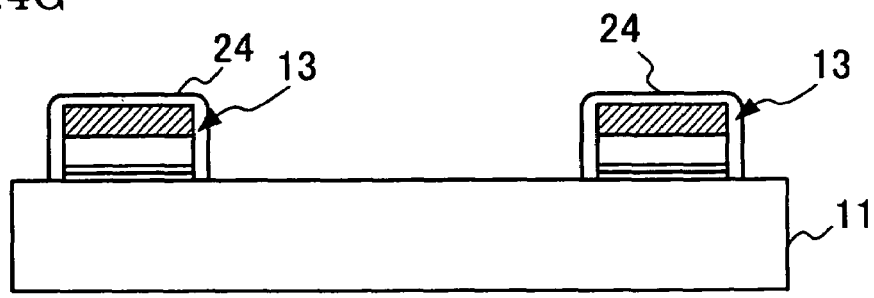
FIG. 4G to 4K are views illustrating the manufacturing processes of the optical bench.
Figure 4H:
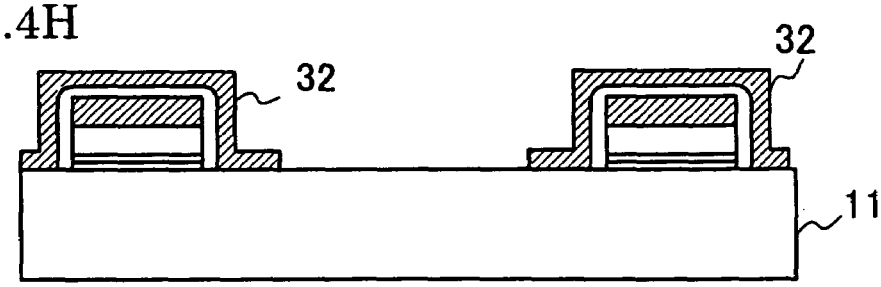
Figure 4I:
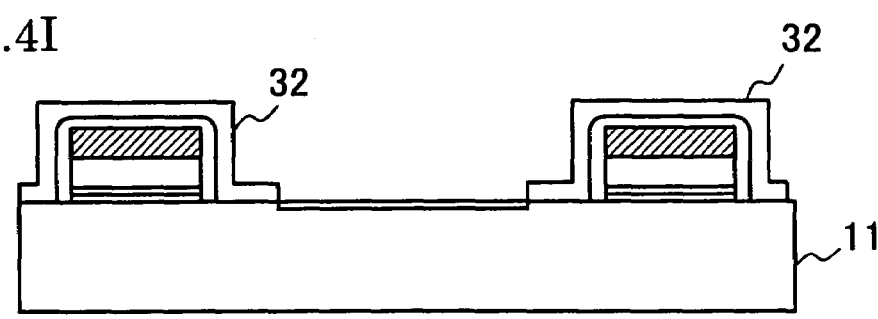
Figure 4J:
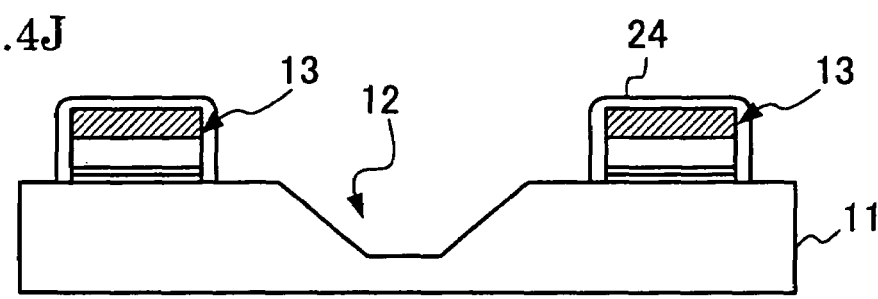
Figure 4K:
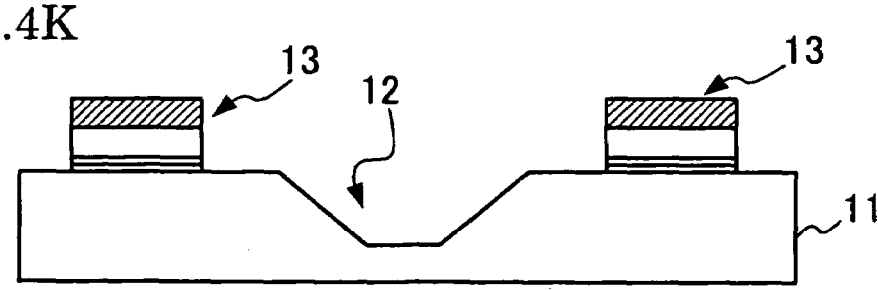

The manufacturing processes will be described further with reference to FIGS. 4G to 4K. After the aforementioned manufacturing of the wiring 13, and before the start of a deep groove manufacturing process which uses a strong alkali such as KOH, as shown in FIG. 4G, it is possible to include a process in which Ni electroless plating processing to protect the wiring 13 is executed, e.g., a process in which an Ni protective film 24 with a thickness of about 2 μm is coated. Subsequently, in order to remove the oxide film ($SiO_2$), coating of resist 32 and patterning are executed as shown in FIG. 4H. Next, in the hydrofluoric acid etching process, as shown in FIG. 4I, the oxide film originally formed on the Si substrate 11 is removed using a hydrofluoric acid in accordance with a pattern in which a groove 12 is formed. Then, after the removal of the resist 32, an isotropic etching which uses KOH, a strong alkali, is executed to form the groove 12 to mount a lens, as shown in FIG. 4J. At the time, slight spot-like corrosion has occurred on the surface of the wiring 13 because of KOH, but a level thereof was very low, thereby giving no practical damage. Then, at the end, as shown in FIG. 4K, the Ni protective film 24 is removed by being dipped into a sulfuric acid/ferric sulfate solution to complete the optical bench 10. Examination by the inventors et. al., has found no corrosion on the wiring film surface after the removal of the Ni protective film 24. Additionally, the Si has not been corroded by dipping in the sulfuric acid/ferric sulfate solution when Ni protective film 24 was removed. It was made possible to achieve wiring accuracy of within ±3 μm. Thus, according to the embodiment, since the wiring 13 is manufactured before the groove 12 is manufactured, i.e., in a state in which the oxide film is added on the surface of the Si substrate 11 wafer, it is possible to make the high-temperature oxidation processing, which has been conventionally needed, unnecessary and thus to greatly shorten the process time.

In the manufacturing processes using KOH shown in FIG. 4J, for example, by setting a concentration of a potassium hydroxide solution to about 40 wt % (60° C.) and etching time to about 33 hours, a groove 12 with a thickness of about 0.8 mm can be formed. If a certain degree of roughness is allowed to take place on the manufactured surface, a tetramethylammonium hydroxide (TMAH) or the like, for example, can be used for an alkali etching solution as well as KOH.

As described above, the removal of the Ni protective film 24 shown in FIG. 4K is executed by using an etching solution, e.g., a sulfuric acid etching solution, which gives no damage to the Si substrate 11 or the Au film 23. Even if a predetermined resistant film, a high-temperature solder land and/or the like are disposed, a protective film can be similarly formed by combining them and removed. However, such a resistant film or the like can be formed by printing after the groove 12 is manufactured.

The manufacturing processes shown in FIGS. 3A to 4K comprise the Au electroless plating process of forming the Au film 23 shown in FIG. 3F, the Ni electroless plating process of forming the Ni protective film 24 with a thickness of about 2 μm which constitutes a protective film against KOH shown in FIG. 4G, and the Ni protective film removing process of removing the Ni protective film 24 shown in FIG. 4K. However, good results can be obtained even if the process of forming the Ni protective film 24 is removed, and the processes of FIG. 4G and 4K are omitted.

Figure 5A:
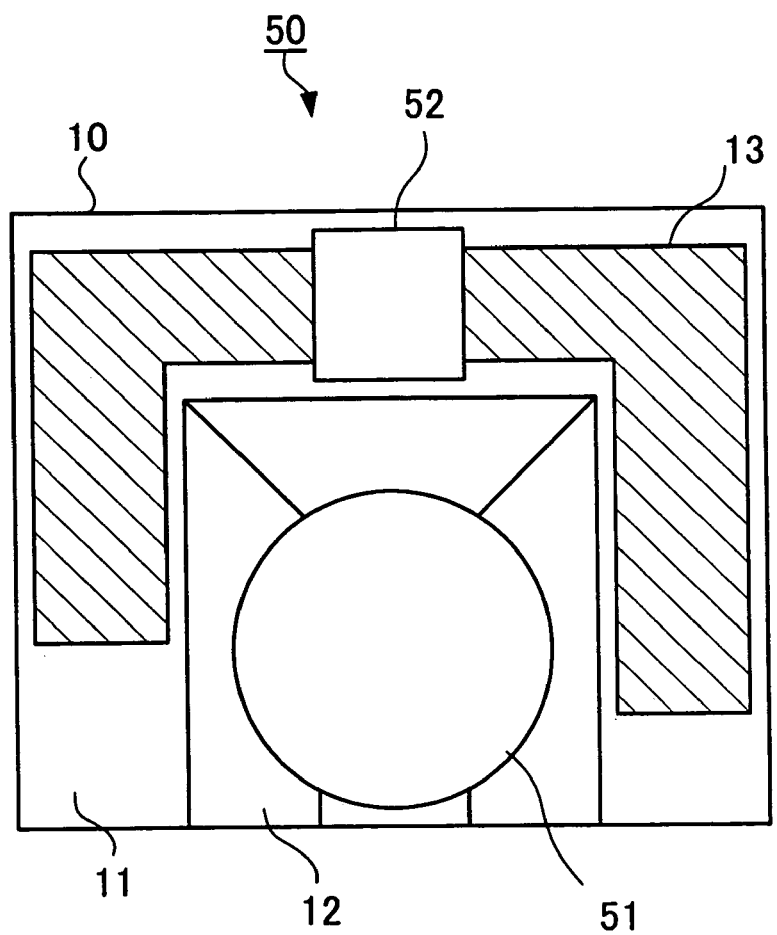
FIGS. 5A and 5B are views showing an example of an optical module according to the embodiment of the present invention.
Figure 5B:
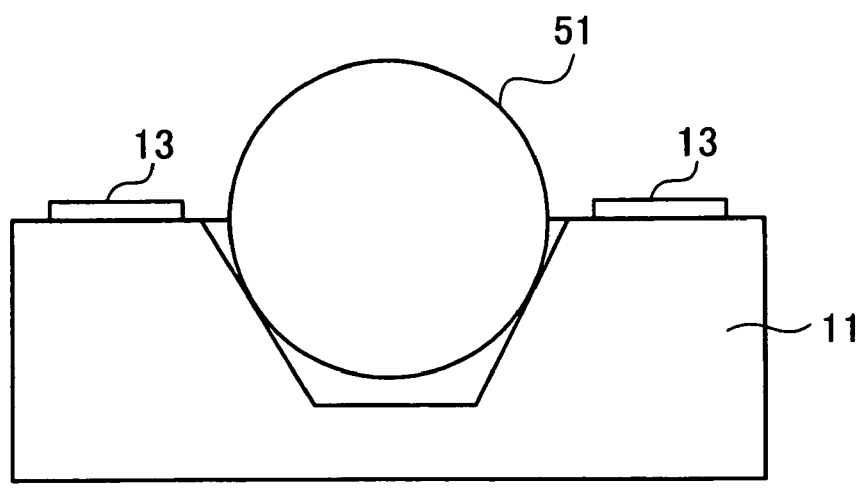

FIGS. 5A and 5B are views showing an example of an optical module according to the embodiment. In an optical module 50 shown in FIGS. 5A and 5B, an optical component, e.g., a lens 51, which is a quartz coupling lens, is mounted in the groove 12 of the optical bench 10. A laser diode 52, which is a driver component, is mounted on the wiring 13 of the optical bench 10. According to the embodiment of the optical module 50 shown in FIGS. 5A and 5B, the lens 51 is positioned after the laser diode 52 is mounted in a predetermined position on the wiring 13. Subsequently, the lens 51 is fixed to the Si substrate 11 by using an adhesive or the like. According to the embodiment, since the optical bench 10 is manufactured by the aforementioned processes, the wiring 13 has high accuracy of within ±3 μm. As a result, it is possible to improve assembling consistency in the optical module 50. Other optical components/driver components which can be mounted on the optical module 50 include a fiber, a mirror, a filter, a switch, and the like.

Figure 7:
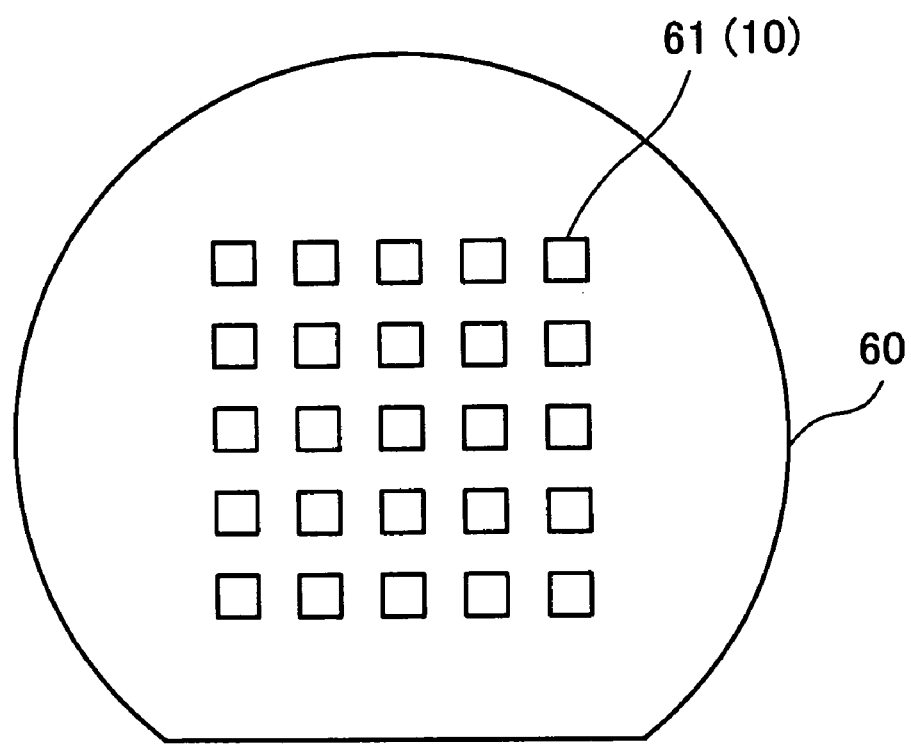
FIG. 7 is a view schematically showing a state of a wafer before the optical bench is cut out according to the embodiment.

FIG. 7 is a view schematically showing a wafer state before the optical benches 10 according to the embodiment are cut out. As shown in FIG. 7, a plurality of chips 61 (optical benches 10) before the optical benches are cut out are arrayed on a wafer 60. As a form, in which an optical bench is provided to the user, an optical bench device may be provided in the state of a manufactured wafer 60, which has undergone the process, as well as in the state of the chip 61. In such a case, each chip 61 is cut out before use by the user, who obtains the wafer 60.

As detailed above, according to the embodiment, first, the wiring 13 is formed not by sputtering or a thin-film but by the plating process. Thus, productivity can be increased, and high cost merit can be obtained. Additionally, since the groove 12 is manufactured after the wiring 13 is manufactured, the process workability can be increased, and the yield can be improved. That is, while the yield is 50% or lower in the conventional process shown in the flow of FIG. 6, the yield can be increased to 75% or higher in the processes of the embodiment shown in FIGS. 3A to 4K. Further, according to the embodiment in which no Ni protective film 24 is formed and the processes of FIGS. 4G and 4K are omitted, the yield can be increased to 80% or higher. Thus, in the manufacturing processes according to the embodiment, since sputtering is replaced with plating, and the high-temperature oxidation process becomes unnecessary, the process time can be greatly shortened, thereby making it possible to reduce time necessary to process one wafer to about ⅗, and further to reduce such time to about ½ in the embodiment, in which no Ni protective film 24 is formed. Furthermore, in the optical bench 10 according to the embodiment, which is formed in the described above, no thick oxide film other than a nano-order natural oxide film is formed in the groove 12 part. In addition, no SiO₂ flash is generated at the corners of the groove 12. Thus, no flash is left different from the conventional case, and no special process is necessary to remove flashes.

Figure 8:
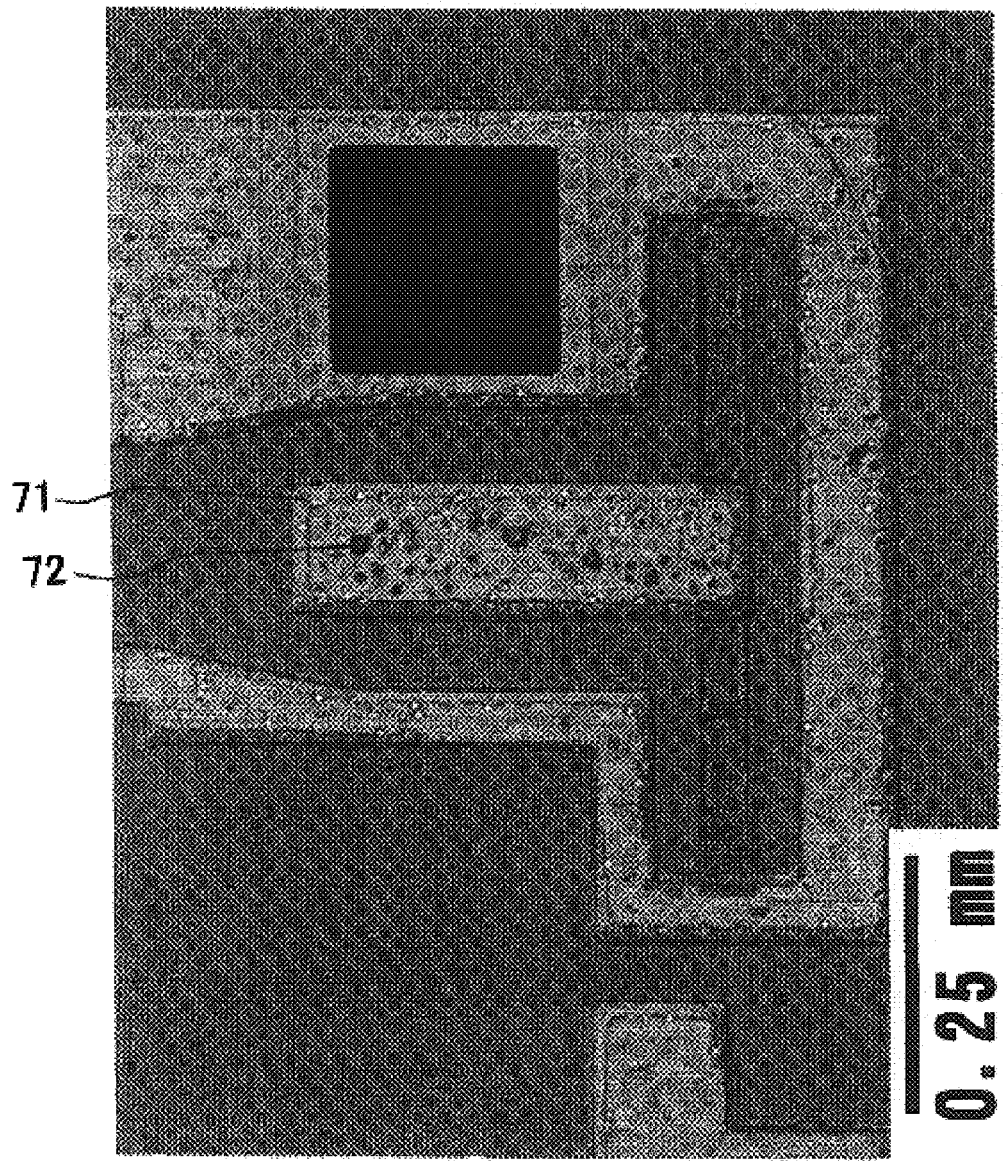
FIG. 8 is a view showing an example of a state of a product by a conventional method of forming a wiring by sputter or vapor deposition.
Figure 9:
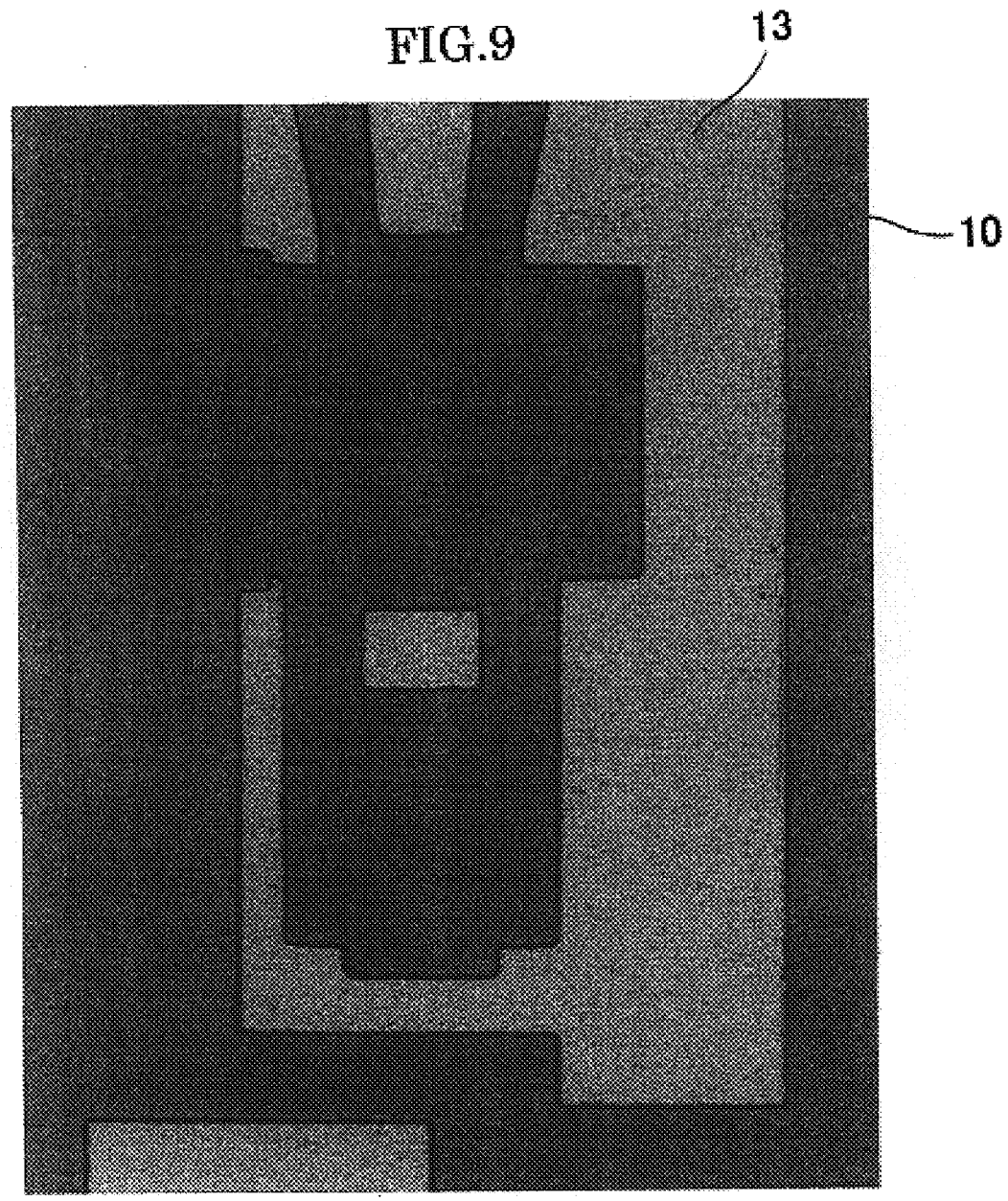
FIG. 9 is a view showing an example of a state of the optical bench formed according to the embodiment.

FIGS. 8 and 9 are views illustrating states of optical benches 10 according to the embodiment. FIG. 8 shows an example of a state of a product by a conventional method which forms a wiring by sputtering or vapor deposition. There is a defect 72 such as a micro void, a pinhole or the like in a metal film of a formed wiring 71. If the wiring 71 is dipped in a strong alkali etching solution such as KOH, pitting corrosion or the like occurs. On the other hand, FIG. 9 shows an example of a state of the optical bench 10 according to the embodiment. Since the wiring 13 is formed of plating according to the embodiment, no micro void or pinhole is present in the wiring metal film, and a film quality nearly equal to that of a bulk metal is obtained. As a result, high corrosion resistance intrinsic to the metal can be exhibited, and no problem such as pitting corrosion occurs even when the wiring is dipped in a strong alkali etching solution such as KOH. Thus, the wiring can be formed by wet processing which uses a strong alkali before the formation of the deep groove, and the manufacturing processes of the optical bench can be simplified.

Thus, according to the present invention, it is possible to drastically increase efficiency in the manufacturing processes of the substrate in which the groove is manufactured and the wiring is formed, and to facilitate improvement of the yield and shortening of the process time.

The present invention can be applied to an optical bench on which an optical component is mounted, a silicon wafer substrate, a wafer in which chips are arrayed, and manufacturing methods thereof.

What is claimed is:

1. A method for manufacturing an optical bench that has an optical component mounted thereon, comprising:
   a plating process of forming a wiring pattern of a metal thin-film by electroless plating on a substrate; and subsequently
   a groove manufacturing process of manufacturing a groove by wet processing in the substrate having the wiring pattern formed by the plating process,
   wherein the groove manufacturing process removes an oxide film from the groove part of the substrate, and subsequently forms the groove in the part having the oxide film removed therefrom by dipping the substrate in a strong alkali solution.

2. A method for manufacturing an optical bench according to claim 1, wherein the plating process forms the wiring pattern by the electroless plating.

3. A method for manufacturing an optical bench according to claim 1, wherein the plating process includes a plurality of plating processes, at least one of which executes electroless plating processing on the wiring pattern without any mask.

4. A method for manufacturing an optical bench according to claim 1, wherein the groove manufacturing process forms the groove in the substrate made of a silicon wafer as material by micromachining which uses the wet processing.

5. A method for manufacturing an optical bench according to claim 1, further comprising:

a protective film forming process of coating the wiring pattern formed by the plating process with a protective film; and a protective film removing process of removing the protective film after the groove manufacturing process.

6. A method for manufacturing an optical bench according to claim 5, wherein the protective film forming process forms a protective film made of a metal containing nickel.

7. A method for manufacturing an optical bench according to claim 1, wherein no oxide film other than a natural oxide film is formed in the groove.

\* \* \* \* \*